United States Patent [19]

Purdes et al.

[11] Patent Number: 5,175,019
[45] Date of Patent: Dec. 29, 1992

[54] METHOD FOR DEPOSITING A THIN FILM

[75] Inventors: Andrew J. Purdes, Garland; Francis G. Celli, Dallas, both of Tex.

[73] Assignee: Texas Instruments Incorporated, Dallas, Tex.

[21] Appl. No.: 769,938

[22] Filed: Sep. 30, 1991

[51] Int. Cl.⁵ .............................................. B05D 3/06
[52] U.S. Cl. .................................. 427/573; 427/249; 427/255.1; 427/314; 427/372.2
[58] Field of Search ..................... 427/38–41, 427/249, 255.1, 314, 372.2

Primary Examiner—Bernard Pianalto
Attorney, Agent, or Firm—Richard A. Stoltz; Richard L. Donaldson; Jay Cantor

[57] ABSTRACT

A microwave plasma rector is disclosed comprising a vacuum chamber, a microwave generator for generating a microwave standing wave therein, inlet and outlet ports, a susceptor within the chamber, at least one dielectric plate and a heater for heating the susceptor. The dielectric plate alters the shape of the produced plasma from a sphere to a short bulging cylinder. The modified plasma ball results in increased thickness uniformity of the deposited material.

12 Claims, 2 Drawing Sheets

U.S. Patent        Dec. 29, 1992        Sheet 1 of 2        5,175,019
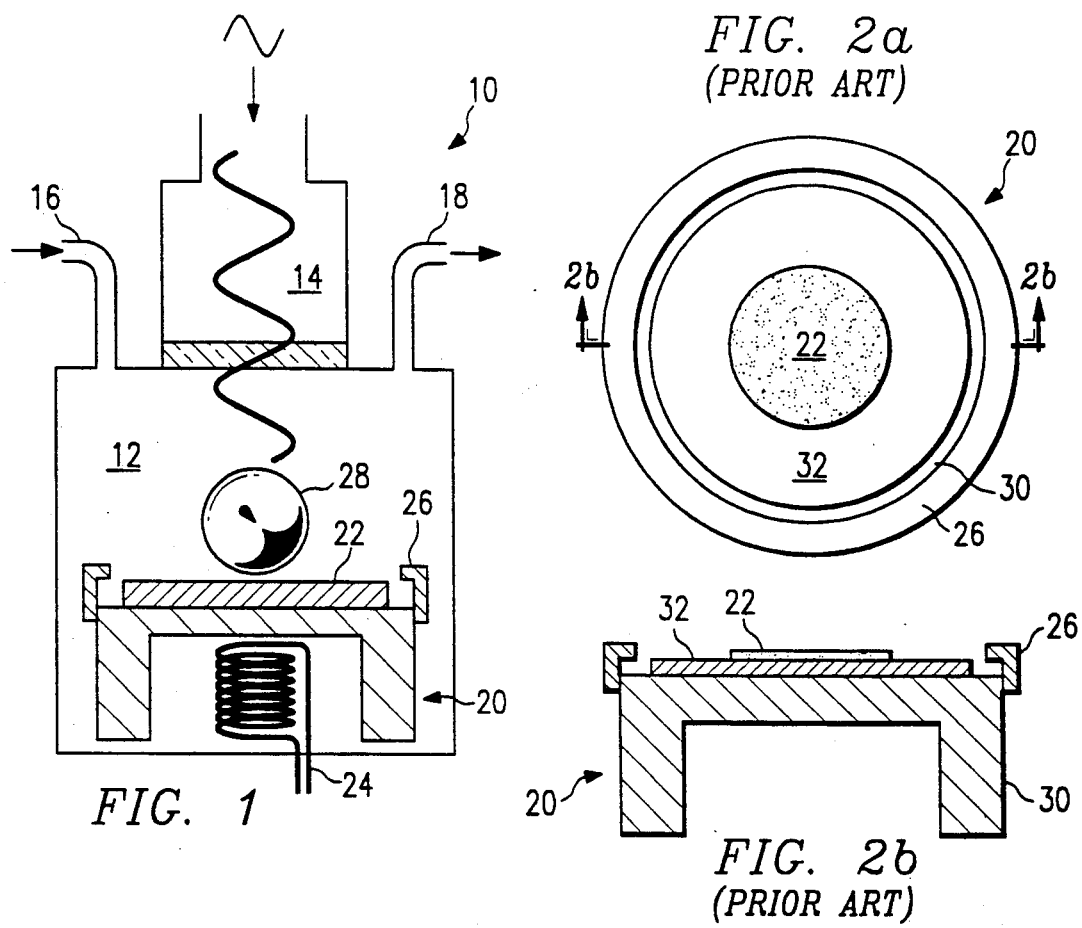
FIG. 1
FIG. 2a
(PRIOR ART)
FIG. 2b
(PRIOR ART)
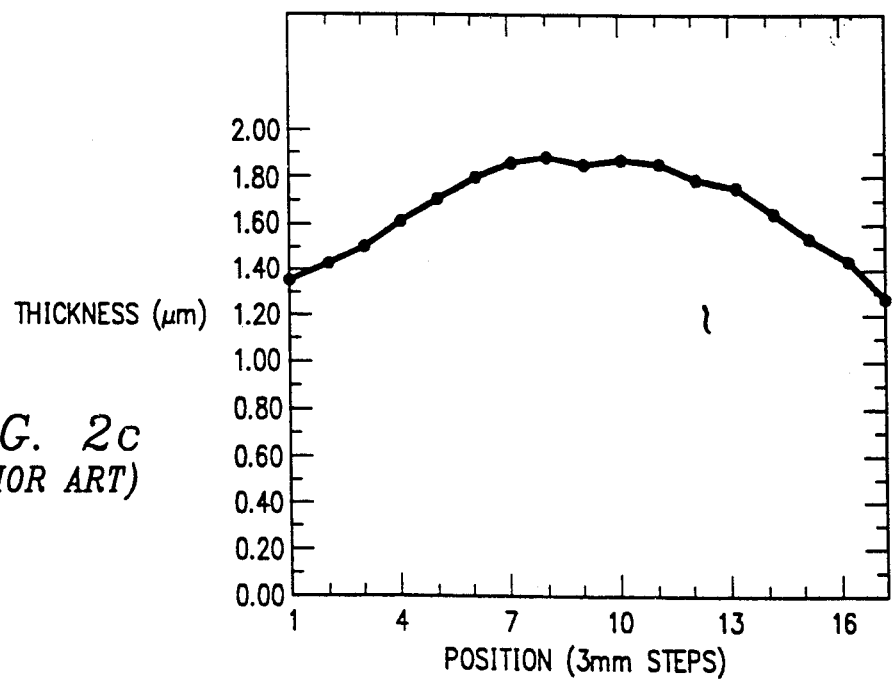
FIG. 2c
(PRIOR ART)

METHOD FOR DEPOSITING A THIN FILM

TECHNICAL FIELD OF THE INVENTION

This invention relates in general to manufacturing devices and methods and more particularly to an improved microwave plasma reactor and method of use.

BACKGROUND OF THE INVENTION

Certain crystalline materials may be manufactured or "grown" on a work piece or "substrate" under certain atmospheric and electromagnetic conditions. In particular, several materials of carbon and silicon may be grown on a wafer in the presence of ionized carbon or silicon, hydrogen, and a standing microwave. Such devices or "reactors" grow diamond, diamond-like carbon, and silicon carbide films.

Such films produced by chemical vapor deposition ("CVD") have many applications, from wear coatings and optical elements to electronic applications and packaging and as active components. For many of these applications, control of the film thickness, is important. Furthermore, uniformity of film thickness may be critical. For instance, thickness uniformity of approximately five percent is required of diamond films for use in x-ray lithography.

Currently, microwave plasma reactors are only able to produce films by CVD processes with thickness uniformities of 20 to 25 percent over a two inch diameter substrate.

Therefore a need has arisen for a method of producing uniform films in microwave plasma reactors.

SUMMARY OF THE INVENTION

In accordance with the present invention, a microwave plasma reactor for producing uniform films is provided which substantially eliminates or reduces disadvantages and problems associated with prior techniques.

A microwave plasma reactor is disclosed comprising a vacuum chamber, a microwave generator for generating a microwave standing wave therein, inlet and outlet ports, a susceptor within the chamber, at least one dielectric plate and a heater for heating the susceptor.

One technical advantage of the disclosed invention is that a uniform film may be produced suitable for applications as demanding as x-ray lithography. Typically, the resulting film has a thickness uniformity of approximately five percent.

BRIEF DESCRIPTION OF THE DRAWINGS

For a more complete understanding of the present invention, and the advantages thereof, reference is now made to the following description taken in conjunction with the accompany diagrams, in which:

FIG. 1 is a partially schematic, partially cross-sectional view of a microwave plasma reactor known in the art;

FIG. 2a is a plan view of a susceptor known in the art for use with the microwave plasma reactor depicted in FIG. 1;

FIG. 2b is a cross-sectional view taken along line 2b—2b of FIG. 2ia;

FIG. 2c is a graphic representation of the thickness of a typical film produced by the susceptor illustrated in FIGS. 2a and 2b;

FIG. 3b is a graphical representation of the thickness of a typical film produced by the microwave plasma reactor illustrated in FIG. 3a.

DETAILED DESCRIPTION OF THE INVENTION

Figure 3A:
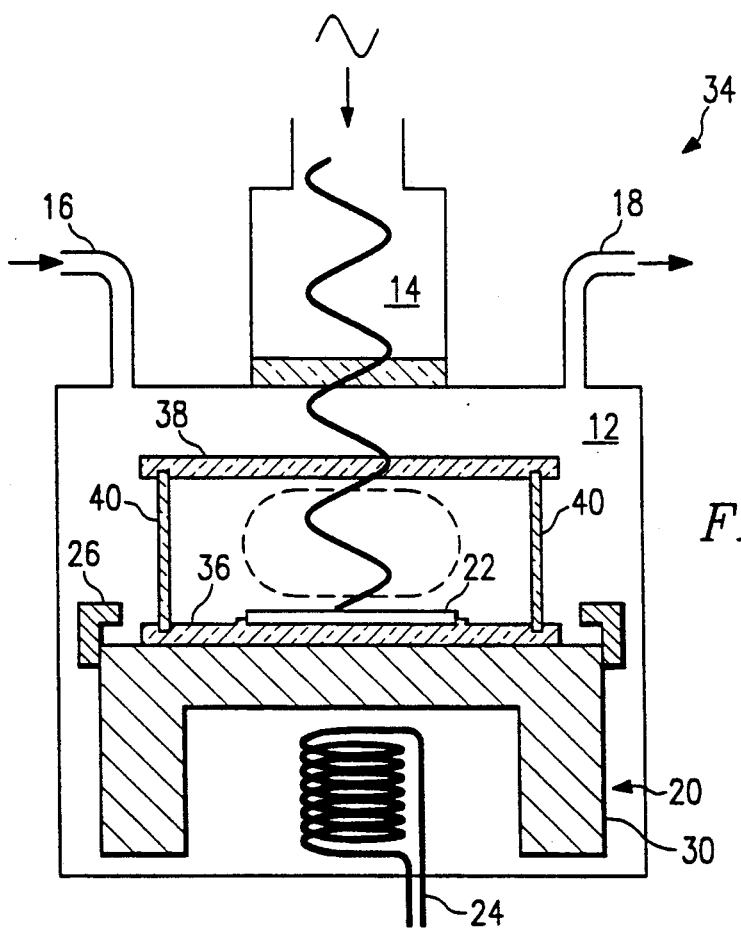
FIG. 3a is a partially schematic, partially cross-sectional view of a microwave plasma reactor containing a first embodiment of the disclosed invention.

The preferred embodiment of the present invention and its advantages are best understood by referring to FIGS. 1 through 4b of the drawings, like numerals being used for like and corresponding parts of the various drawings.

FIG. 1 is a partially schematic, partially cross-sectional view of a microwave plasma reactor known in the art. Such a reactor may be purchased from the AsTEX Company of Woburn, Massachusetts, for chemical vapor deposition ("CVD") of various materials. The reactor 10 comprises a vacuum chamber 12, a microwave generator 14, an inlet port 16 for introducing reactants into the vacuum chamber 12, an outlet port 18 for evacuating the vacuum chamber 12, a susceptor 20 for holding a workpiece 22, and a heater 24 for heating the susceptor and workpiece. The susceptor 20 is typically made of graphite while the heater 24 may be a radio frequency ("rf") or resistive heater. If heater 24 is a rf induction heater then a corona ring 26 must be included to prevent a plasma from forming near the walls of vacuum chamber 12.

In operation, the vacuum chamber 12 is initially evacuated through the outlet port 18, heater 24 is activated, reactants are introduced through the inlet port 16 and a microwave standing wave is formed within the vacuum chamber 12 by the microwave generator 14. The microwave standing wave induces a generally spherical plasma ball 28 of ionized gases immediately above susceptor 20 which causes a particular film to grow on the workpiece 22. The particular composition of the plasma ball 28 and grown film depends upon the particular composition of introduced reactants.

FIG. 2a is a plan view of a susceptor 20 known in the art for use with a microwave plasma reactor depicted in FIG. 1. Prior susceptors comprised a graphite base 30 on which a workpiece or substrate 22 is mounted. Typically, the workpiece 22 is a silicon wafer or other article to be coated by the grown film. A conducting plate 32 may be included to protect the graphite base 26 from being etched during operation. The conducting plate 32 may be manufactured from materials such as molybdenum. FIG. 2b is a cross-sectional view taken along line 2b—2b of FIG. 2a depicting the vertical integration of the base 30, the conducting plate 32, the workpiece 22 and the corona ring 26.

FIG. 2c is a graphic representation of the thickness of a typical film produced by the susceptor illustrated in FIGS. 2a and 2b. The nonuniformity of the film thickness produced by the susceptor of FIGS. 2a and 2b is believed to be caused by the spherical shape of the induced plasma. The spherical shape of the plasma may cause local variations in reactant concentrations and substrate temperature. Known susceptors typically are only able to maintain thickness uniformity of 20 to 25 percent over a two inch substrate.

FIG. 3a is a partially schematic, partially cross-sectional view of a microwave plasma reactor 34 containing one embodiment of the disclosed invention. Here, the metal plate 28 (shown in FIGS. 2a and 2b) has been replaced with a dielectric plate 36. A second dielectric plate 38 is suspended above workpiece 22 and is supported by, for instance, a set of dielectric pins 40. The plates and pins may be made of such dielectric materials as quartz ($SiO_2$) or of alumina ($Al_2O_3$) when plasmas are produced which chemically react with quartz.

Figure 3B:
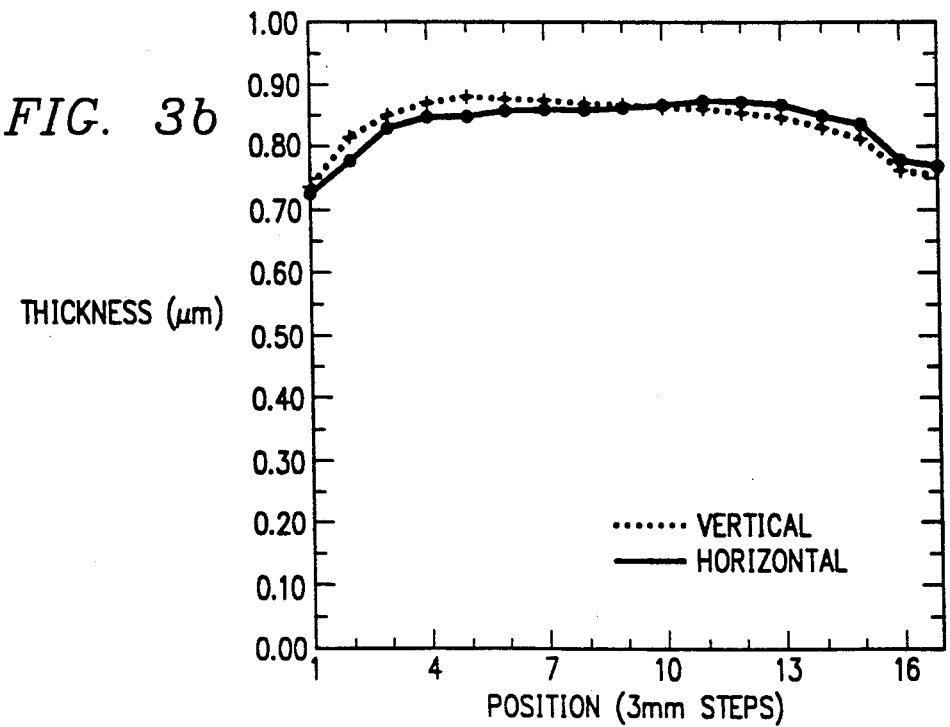

The resultant diamond film thickness produced by the reactor 34 is shown in FIG. 3b and indicates a uniformity of approximately 5 percent in both the horizontal and vertical dimensions of the substrate 22. It is believed that the plasma ball is modified near the dielectric plates 36 and 38. In particular, the plasma ball is flattened into a short bulging cylinder as depicted by the dashed lines in FIG. 3a. This shape results in more uniform reactant concentration and substrate temperature.

EXAMPLE

The particular results of FIG. 3b were produced using a gas pressure of 20 Torr, a gas flow rate of 40 sccm, a gas mixture rate of one percent $CH_4$ to $H_2$, 1.1 kW of 2.45 GHz microwave energy, a rf heater setpoint of 700° C. and a substrate temperature range of 800 to 1000° C. A two inch silicon workpiece was placed on a dielectric plate four inches in diameter, while a three inch diameter upper plate was suspended 1.875 inches above the workpiece. Both plates were approximately one-eighth inch in thickness.

The apparatus depicted in FIG. 3a may be modified to produce a second and third embodiment of the disclosed invention. In the second embodiment, the lower dielectric plate 36 (FIG. 3a) is omitted. In the third embodiment, the lower dielectric plate 36 is replaced with a conducting plate which protects the base 30 (FIG. 3a) from being etched. It may be manufactured from materials such as molybdenum. The plasma ball electromagnetically acts as though no lower dielectric plate were present in the second and third embodiments. Both of these embodiments flatten the plasma ball near the upper plate 38 increasing the resultant film thickness uniformity.

In the first embodiment of the disclosed invention, the dielectric plate may be suspended from one to two inches above a two inch diameter workpiece. In all of the embodiments, the dielectric plates may range in diameter from one to four inches when used with a two inch substrate.

Although the present invention and its advantages have been described in detail, it should be understood that various changes, substitutions and alterations can be made herein without departing from the spirit and scope of the invention as defined by the appended claims.

What is claimed is:

1. A method for depositing a thin film of reactants onto a substrate comprising the steps:
    generating a plasma ball of reactants adjacent to a substrate; and
    distorting the plasma ball with a first dielectric plate, the first dielectric plate suspended above and generally parallel to the surface of the substrate.

2. The method of claim 1 further comprising the step of distorting the plasma ball with a second dielectric plate, the second dielectric plate below and generally parallel to the substrate.

3. The method of claim 2 wherein said distorting steps each further comprise the step of distorting the plasma with a first and second dielectric plate of quartz.

4. The method of claim 2 wherein said distorting steps each further comprise the step of distorting the plasma with a first and second dielectric plate of alumina.

5. The method of claim 1 wherein said distorting step further comprises the step of distorting the plasma with a dielectric plate of quartz.

6. The method of claim 1 wherein said distorting step further comprises the step of distorting the plasma with a dielectric plate of alumina.

7. The method of depositing a diamond film on a substrate comprising the steps of:
    generating a plasma ball of carbon and hydrogen-bearing species adjacent to the surface of a substrate;
    distorting the plasma ball with a first dielectric plate, the first dielectric plate suspended above and generally parallel to the surface of the surface of the substrate; and
    heating and substrate.

8. The method of claim 7 further comprising the step of distorting the plasma ball with a second dielectric plate, the second dielectric plate below and generally parallel to the substrate.

9. The method of claim 8 wherein the distorting steps each further comprise the step of distorting the plasma with a first and second dielectric plate of quartz.

10. The method of claim 9 wherein the generating step comprises the step of generating a plasma from methane.

11. The method of claim 7 wherein the distorting step further comprises the step of distorting the plasma with a dielectric plate of quartz.

12. The method of claim 11 wherein the generating step comprises the step of generating a plasma from methane.

* * * * *